United States Patent
Wagner et al.

(10) Patent No.: US 9,966,931 B2
(45) Date of Patent: May 8, 2018

(54) ACTIVE QUASI CIRCULATOR

(71) Applicant: Infineon Technologies AG, Neubiberg (DE)

(72) Inventors: Christoph Wagner, Enns (AT); Matthias Porranzl, Hofamt Priel (AT)

(73) Assignee: Infineon Technologies AG, Neubiberg (DE)

( * ) Notice: Subject to any disclaimer, the term of this patent is extended or adjusted under 35 U.S.C. 154(b) by 476 days.

(21) Appl. No.: 14/555,623

(22) Filed: Nov. 27, 2014

(65) Prior Publication Data
US 2016/0156085 A1 Jun. 2, 2016

(51) Int. Cl.
*H03H 11/34* (2006.01)
*H01P 1/383* (2006.01)
*H01P 1/18* (2006.01)
*H03F 3/45* (2006.01)
*H03H 11/36* (2006.01)
*H03F 1/56* (2006.01)
*H03F 3/60* (2006.01)

(52) U.S. Cl.
CPC ............. *H03H 11/34* (2013.01); *H01P 1/18* (2013.01); *H01P 1/383* (2013.01); *H03F 1/565* (2013.01); *H03F 3/4508* (2013.01); *H03F 3/45076* (2013.01); *H03F 3/60* (2013.01); *H03H 11/36* (2013.01); *H03F 2200/451* (2013.01); *H03F 2203/45034* (2013.01)

(58) Field of Classification Search
CPC .. H01P 1/38; H01P 1/213; H01P 1/383; H01P 1/387; H01P 1/39; H01P 1/393; H01P 1/397; H01P 1/18; H03F 2203/45034; H03F 3/45076; H03F 2200/451; H03H 11/34; H03H 11/36

USPC ......... 333/1.1, 132, 1, 24 R, 24.1, 100, 109; 330/286; 455/1, 78, 83
See application file for complete search history.

(56) References Cited

U.S. PATENT DOCUMENTS

2006/0133599 A1* 6/2006 Pagnanelli ............. H04B 1/525
379/406.08

OTHER PUBLICATIONS

Wu et al, "CMOS Active Quasi-Circulator with dual transmission gains incorporating feedforward technique at K-band", Aug. 2010, IEEE transactions on microwave theory and techniques, vol. 58, p. 2084-2091.*

(Continued)

*Primary Examiner* — Benny Lee
*Assistant Examiner* — Hafizur Rahman
(74) *Attorney, Agent, or Firm* — Eschweiler & Potashnik, LLC (57) ABSTRACT

An RF quasi circulator circuit is described herein. In accordance with one example of the disclosure the circuit includes a receive port, a transmit port and an antenna port as well as a differential amplifier stage having a first input, a second input and an output that is coupled to the receive port. The circuit further includes a first phase shifting element and a second phase shifting element. The first phase shifting element is coupled between the transmit port and the first input of the differential amplifier and the second phase shifting element is coupled between the transmit port and the second input of the differential amplifier. A tunable impedance is coupled to the differential amplifier, and the antenna port is coupled to the first input of the differential amplifier. The tunable impedance is controlled to tune the damping in a signal path from the transmit port to the receive port.

20 Claims, 5 Drawing Sheets

(56) References Cited

OTHER PUBLICATIONS

Huang et. al., "A 24-GHz Low Power and High Isolation Active Quasi-Circulator", 2012 IEEE/MTT-S International Microwave Symposium Digest, Jun. 2012, pp. 1-3.*
Lu et. al.,"On the Feasibility of CMOS Multiband Phase Shifters for Multiple-Antenna Transmitters", IEEE Microwave and Wireless Components Letters, vol. 16, No. 5, May 2006, pp. 255-257.*

* cited by examiner

ACTIVE QUASI CIRCULATOR

FIELD

The present disclosure relates to the field of radio frequency (RF) circuits, in particular to the field of active circulator and directional coupler circuits.

BACKGROUND

Radio frequency (RF) receivers and transceivers can be found in numerous applications, particularly in the field of wireless communications and radar sensors. For example in the automotive sector, there is an increasing demand for radar sensors used in so-called "adaptive cruise control" (ACC) or "radar cruise control" systems. Such systems may be used to automatically adjust the speed of an automobile so as to maintain a safe distance from other automobiles ahead.

Modern radar systems make use of highly integrated RF circuits (MMICs, monolithic microwave integrated circuits), which may incorporate all core functions of an RF transmit and receive module (also referred to as "RF font-end") of a radar transceiver in one single package (single chip transceiver). Such RF front-ends may include, inter alia, a voltage controlled oscillator (VCO), power amplifiers (PA), mixers, and analog-to-digital converters (ADC) and also a circulator or directional coupler.

One characteristic function of transmit and receive modules (RF front-ends) with one or more shared transmit and receive antenna is the separation of the strong transmit signal (TX) from the weak receive signal (RX). Traditionally, this function is implemented by passive devices (circulators, directional couplers), which
have large physical dimensions. Moreover, such passive devices usually exhibit undesired transmission losses. There is a need to replace the mentioned passive devices with active devices, which are a smaller in size and more efficient with regard to transmission losses.

SUMMARY

An RF quasi circulator circuit is described herein. In accordance with one example of the invention the circuit includes a receive port, a transmit port and an antenna port as well as a differential amplifier stage having a first input, a second input and an output that is coupled to the receive port. The circuit further includes a first phase shifting element and a second phase shifting element. The first phase shifting element is coupled between the transmit port and the first input of the differential amplifier and the second phase shifting element is coupled between the transmit port and the second input of the differential amplifier. A tunable impedance is coupled to the differential amplifier, and the antenna port is coupled to the first input of the differential amplifier. The tunable impedance is controlled to tune the damping in a signal path from the transmit port to the receive port In accordance with another example of the invention the circuit includes a receive port, a transmit port and an antenna port. It further includes a first amplifier stage coupling the transmit port to the antenna port and configured to direct signals received at the transmit port to the antenna port. A second amplifier stage couples the antenna port and the receive port. The second transistor stage is configured to direct signals received at the antenna port to the receive port. A tunable impedance is coupled to the second transistor stage and is controlled to tune the damping in a signal path from the transmit port to the receive port.

BRIEF DESCRIPTION OF THE DRAWINGS

The invention can be better understood with reference to the following drawings and descriptions. The components in the figures are not necessarily to scale; instead emphasis is placed upon illustrating the principles of the invention. More-over, in the figures, like reference numerals designate corresponding parts. In the drawings.

DETAILED DESCRIPTION

As mentioned above, a typical function of transmit and receive modules (RF front-ends) with one or more shared transmit and receive antenna is the separation of the strong transmit signal from the weak receive signal. For this purpose, passive devices (e.g., circulators and directional couplers) are commonly used. However, such passive devices often require much space and exhibit undesired transmission losses. One approach to improve the situation is to replace the mentioned passive devices by active devices, which may be designed to be more efficient with regard to losses and smaller in size. Generally, the isolation between an RX port and an TX port of the device is a relevant parameter as it determines the level of the blocker signal (i.e. the portion of the transmit signal which is transmitted from the TX port to the RX port, in an ideal case the blocker signal is zero) of the first devices in the receiver part.

Figure 1:
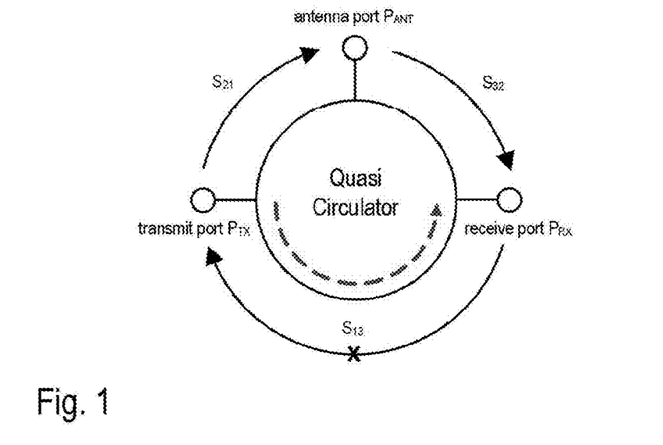
FIG. 1 is a schematic diagram of a circulator.

FIG. 1 illustrates an example circulator in a schematic diagram. Generally, a circulator for an RF frontend in a radar or communication device has three terminals which are usually referred to as ports. In the example of FIG. 1, the circulator has three ports $P_{TX}$, $P_{ANT}$, and $P_{RX}$, wherein $P_{TX}$ is the transmit port (where the transmit signal TX is applied), $P_{ANT}$ is the antenna port (coupled to the antenna), and $P_{RX}$ is the receive port (where the receive signal RX is provided). When designing an active quasi circulator (QC), a general design goal is to obtain a high isolation between the transmit port $P_{TX}$ and the receive port $P_{RX}$ as well as a high gain (no or little losses) in the transmission paths from transmit port $P_{TX}$ to antenna port $P_{ANT}$ and from antenna port $P_{ANT}$ to receive port $P_{RX}$. These design goals lead to the following (ideal) matrix of scattering parameters (S-parameters):

$$S_{QC} = \begin{bmatrix} 0 & 0 & 0 \\ G_{21} & 0 & 0 \\ 0 & G_{32} & 0 \end{bmatrix} = \begin{bmatrix} S_{11} & S_{12} & S_{13} \\ S_{21} & S_{22} & S_{23} \\ S_{31} & S_{32} & S_{33} \end{bmatrix}, \quad (1)$$

wherein $S_{21}$ (=$G_{21}$) is the gain from transmit port $P_{TX}$ to antenna port $P_{ANT}$ and $S_{32}$ (=$G_{32}$) is the gain from antenna port $P_{ANT}$ to receive port $P_{RX}$. The parameters $S_{13}$ and $S_{31}$ is ideally zero indicating that receive port $P_{RX}$ and transmit port $P_{TX}$ are mutually isolated from each other. The general concept of S-parameters to describe the characteristics of multi-port devices is as such known and thus not further discussed herein.

Figure 2:
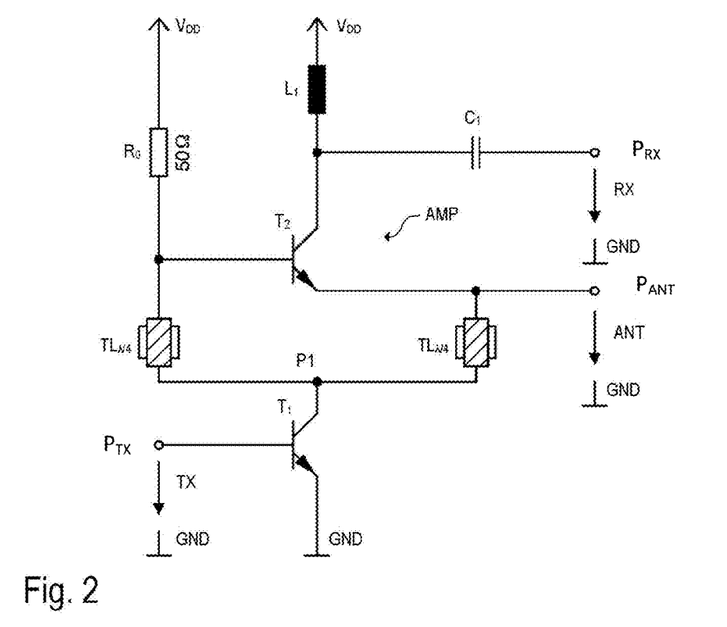
FIG. 2 is a simplified circuit diagram illustrating one example of an active quasi circulator composed of (inter alia) two bipolar transistors.

One exemplary embodiment of a quasi circulator (QC) circuit with three ports is illustrated in FIG. 2. Accordingly, the QC circuit is composed, inter alia, of two bipolar transistors $T_1$, $T_2$, two $\lambda/4$ transmission lines $TL_{\lambda/4}$ and one resistor $R_0$. The transmit port $P_{TX}$, at which the transmit signal TX is applied, is formed by the base terminal of bipolar transistor $T_1$ and a ground terminal GND coupled to a reference potential (e.g., ground potential). The emitter terminal of bipolar transistor $T_1$ is also connected to a ground terminal GND; the collector terminal is connected to a circuit node that is denoted as P1 in FIG. 2. Circuit node P1 is connected to the base terminal of the second bipolar transistor $T_2$ via a first $\lambda/4$ transmission line $TL_{\lambda/4}$. Circuit node P1 is further connected to the emitter terminal of the second transistor $T_2$ via a second $\lambda/4$ transmission line $TL_{\lambda/4}$. The antenna port $P_{ANT}$, to which the antenna is connected, is formed by the emitter terminal of the bipolar transistor $T_2$ and a ground terminal GND. The base terminal of bipolar transistor $T_2$ is coupled to a supply voltage terminal VDD. The collector terminal of the bipolar transistor $T_2$ is connected to the supply voltage terminal VDD via an inductor $L_1$. The receive port $P_{RX}$ is formed by an output terminal, which is connected to the collector of the bipolar transistor via a capacitor $C_1$, and a ground terminal GND. The receive signal RX is provided at the receive port $P_{RX}$.

In the following description the function of the quasi circulator (QC) circuit is describe in more detail. To keep the explanation simple, the receive path (port $P_{ANT}$ to port $P_{RX}$) and the transmit path (port $P_{TX}$ to $P_{ANT}$) are considered one after the other. The bipolar transistor $T_1$ operates as a transconductance amplifier stage, which is configured to amplify the transmit signal TX. At circuit node P1 the amplified signal is distributed over two branches and split in two signals $TX_A$ and $TX_B$. These two signals $TX_A$ and $TX_B$ are both subject to a 90 degree phase rotation caused by the two transmission lines $TL_{\lambda/4}$. As a result, the voltage drop between the base and the emitter of transistor $T_2$ is zero (transistor $T_2$ thus remains off). Therefore, no contribution of the transmit signal TX is transmitted to the receive port $P_{RX}$, and (in an ideal case) the isolation is perfect. The condition for isolation (base-emitter voltage of transistor $T_2$ being zero) is satisfied if the transmit signal TX is equally divided into the two signals $TX_A$ and $TX_B$ (wherein $TX_A=TX_B$). In other words, half of the signal power of the transmit signal TX is directed through the first transmission line $TL_{\lambda/4}$ (to termination resistor $R_0$) and half of the signal power is directed through the second transmission line $TL_{\lambda/4}$ (to the antenna port). This will be the case when the resistance of resistor $R_0$ matches the system impedance $Z_0$ (i.e. $R_0=Z_0$) and the antenna impedance (present at the antenna port $P_{ANT}$).

An antenna signal ANT received by the antenna is applied to the emitter terminal of the bipolar transistor $T_2$ and also directed (with a 180 degree phase rotation) to the base terminal of transistor $T_2$. The signal path from antenna port $P_{ANT}$ to base terminal of transistor $T_2$ causes a 180 degree phase rotation due to the two $\lambda/4$ transmission lines $TL_{\lambda/4}$. Thus, the signals at the emitter and at the base of transistor $T_2$ have a 180 degree phase shift relative to each other and transistor $T_2$ effectively operates as differential amplifier (for signals coming from the antenna), which is generally referred to as differential amplifier AMP. The amplified antenna signal can be tapped at the receive port $P_{RX}$. The inductor $L_1$ and the capacitor $C_1$ are used to decouple the receive port $P_{RX}$ from the DC supply voltage and to decouple the DC supply terminal VDD from any AC signals. Generally, a differential amplifier has two inputs and is configured to amplify the difference of the signals applied at the two inputs; the amplified difference is provided at the amplifier output. A skilled person is aware of various different possibilities to implement a differential amplifier, which is thus not further discussed herein in more detail. In the example of FIG. 1 (as well as in the examples of FIGS. 2, and 4-9) a single transistor $T_2$ is operated as differential amplifier.

Figure 3:
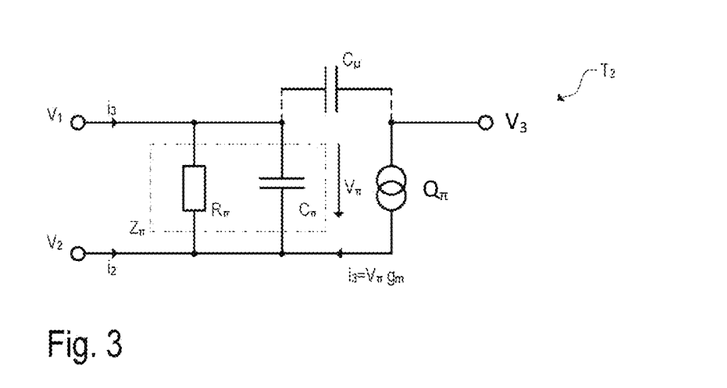
FIG. 3 a circuit diagram illustrating a small-signal model of a bipolar transistor used in the circulator of FIG. 2.

In the following description the circuit of FIG. 2 is analytically analyzed with reference to the VCCS equivalent circuit (VCCS=voltage controlled current source) illustrated in FIG. 3, which represents bipolar transistor $T_2$. In FIG. 3 the impedance $Z_\pi$ represents the differential base-emitter resistance in the operating point of transistor $T_2$. The current source $Q_\pi$ provides a current $i_3$ proportional to the voltage drop $V_\pi$ across impedance $Z_\pi$, that is $i_3=V_\pi \cdot g_m$ and $g_m$ is the differential transconductance of transistor $T_2$ in the operating point. $V_1$ denotes the voltage present at the base terminal of transistor $T_2$, $V_2$ the voltage present at the emitter of transistor $T_2$, and $V_3$ the voltage present at the collector of transistor $T_2$. The equivalent circuit of FIG. 3 is represented by the following matrix $Y_{VCCS}$ of admittance parameters (Y-parameters):

$$Y_{VCCS} = \begin{bmatrix} \dfrac{1}{Z_\pi} & -\dfrac{1}{Z_\pi} & 0 \\ -\dfrac{(Z_\pi g_m + 1)}{Z_\pi} & \dfrac{(Z_\pi g_m + 1)}{Z_\pi} & 0 \\ g_m & -g_m & 0 \end{bmatrix}. \quad (2)$$

The $\lambda/4$ transmission lines $TL_{\lambda/4}$ are represented by the matrix $Y_{TL}$ of Y-parameters (Y-matrix)

$$Y_{TL} = \begin{bmatrix} 0 & \dfrac{j}{Z_1} \\ \dfrac{j}{Z_1} & 0 \end{bmatrix}, \quad (3)$$

wherein $Z_1$ denotes the impedance of the transmission line and j is the imaginary unit. Using equations 1 and 2, the Y-matrix $Y_{QC}$ of the overall quasi circulator of FIG. 2 can be calculated as follows:

$$Y_{QC} = \begin{bmatrix} \dfrac{Z_\pi}{Z_1^2(Y_0 Z_\pi + 1)} & \dfrac{j(Y_0 Z_\pi + 2)}{Z_1(Y_0 Z_\pi + 1)} & 0 \\ \dfrac{j(Y_0 Z_\pi + Z_\pi g_m + 2)}{Z_1(Y_0 Z_\pi + 1)} & \dfrac{Y_0(Z_\pi g_m + 1)}{Y_0 Z_\pi + 1} & 0 \\ -\dfrac{j Z_\pi g_m}{Z_1(Y_0 Z_\pi + 1)} & \dfrac{g_m}{Y_0 Z_\pi + 1} - g_m & 0 \end{bmatrix} \quad (4)$$

Y-matrix $Y_{QC}$ can be transformed into a corresponding matrix $S_{QC}$ of S-parameters (S-matrix), wherein $S_{13}=S_{31}=0$ (isolation condition) and $Y_0=Z_0^{-1}=(50\Omega)^{-1}$:

$$S_{QC} = \begin{bmatrix} 1 - \dfrac{10000}{Z_1^2 + 5000} & \dfrac{j \cdot 100 Z_1(Z_\pi + 100)}{(Z_1^2 + 5000)(Z_\pi + 50 Z_\pi g_m + 100)} & 0 \\ -\dfrac{j \cdot 100 Z_1}{Z_1^2 + 5000} & \dfrac{5000 Z_\pi + 2 Z_1^2 Z_\pi + 100 Z_1^2}{(Z_1^2 + 5000)(Z_\pi + 50 Z_\pi g_m + 100)} - 1 & 0 \\ 0 & \dfrac{100 Z_\pi g_m}{Z_\pi + 50 Z_\pi g_m + 100} & 1 \end{bmatrix} \quad (5)$$

As a result of the matching condition $S_{11}=0$ (no reflection at port $P_{TX}$) the impedance $Z_1$ of the transmission lines $TL_{\lambda/4}$ yields $Z_1=Z_0\sqrt{2}=50\ \Omega\sqrt{2}$ and the S-matrix $S_{QC}$ simplifies to:

$$S_{QC} = \begin{bmatrix} 0 & \dfrac{j \cdot \sqrt{2}\,(Z_\pi + 100)}{2 \cdot (Z_\pi + 50 Z_\pi g_m + 100)} & 0 \\ -\dfrac{j\sqrt{2}}{2} & \dfrac{3 Z_\pi / 2 + 50}{Z_\pi + 50 Z_\pi g_m + 100} - 1 & 0 \\ 0 & \dfrac{100 Z_\pi g_m}{Z_\pi + 50 Z_\pi g_m + 100} & 1 \end{bmatrix} \quad (6)$$

Under the assumption that transistor $T_1$ is unilateral, the parameter $S_{12}$ can be neglected, e.g. $S_{12}=0$. The only parameters, which depend on the size and the biasing (i.e. the operating point) of transistor $T_2$ (i.e., on the impedance $Z_\pi$ and the transconductance $g_m$ of transistor $T_2$) are $S_{32}$ (i.e. the gain from the antenna port $P_{ANT}$ to the receive port $P_{RX}$) and $S_{22}$ (i.e. the matching of the antenna port). It can be seen from equation 6 that one half of the power of the transmit signal is terminated in the termination resistor $R_0$ which the other half is directed to the antenna ($S_{21}=j/\sqrt{2}$).

It has been found that the miller capacitance $C_\mu$ (see FIG. 3), which is effective between the base and the collector of the transistor $T_2$, has an even stronger impact on the matrix $S_{QC}$ of S-parameters than capacitance $C_\pi$. The presence of this parasitic capacitance $C_\pi$ results in the mentioned isolation condition ($S_{13}=S_{31}=0$) not being satisfied with $Y_0=\frac{1}{50}$ $\Omega$, as the circuit is no longer balanced with respect to the circuit node P1 (see FIG. 2). Further parasitic capacitors (e.g. substrate capacitances) may also bring the circuit out-of-balance. Those parasitic capacitances can not be accurately determined and considered in the circuit design. To improve the situation, the termination resistor $R_0$ may be replaced by a tuner circuit as illustrated in the examples described below.

Figure 4:
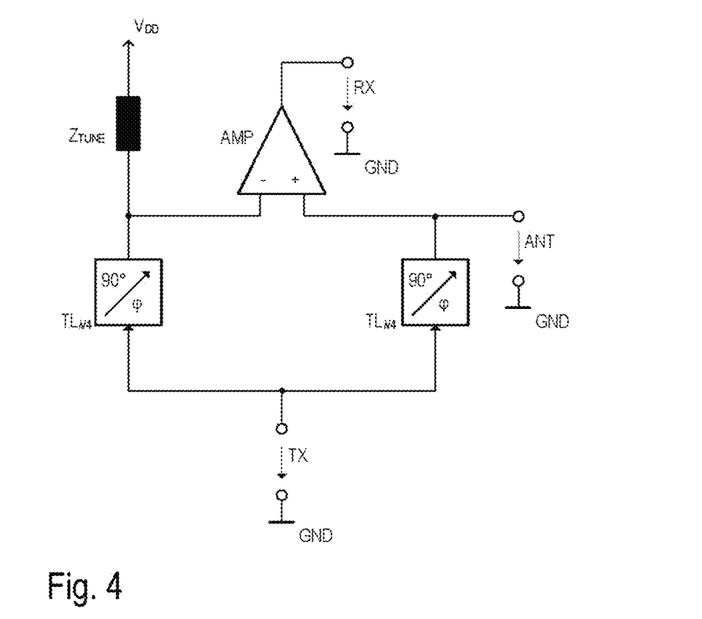
FIG. 4 is a simplified circuit diagram of an active quasi circulator circuit in accordance with a first example of the present disclosure.

FIG. 4 illustrates one example implementation of a quasi-circulator in accordance with one embodiment of the present invention. The function of the circuit of FIG. 4 is basically the same as in the previous example of FIG. 2. However, the present example includes only one differential amplifier AMP (which corresponds to the amplifier stage formed by transistor $T_2$ in FIG. 2) for the amplification of the signal ANT incident at the antenna port $P_{ANT}$. The amplifier output is coupled to the receive port $P_{RX}$, at which the received signal may be tapped.

The differential amplifier AMP has two inputs (an inverting input an a non-inverting input). Each of the two inputs is connected to the transmit port $P_{TX}$ via a 90° phase shifting elements, which may be, for example, $\lambda/4$ transmission lines $TL_{\lambda/4}$. In the present example, the non-inverting input of the differential amplifier AMP is coupled to the antenna port $P_{ANT}$ and the inverting input of the differential amplifier is coupled to a supply voltage $V_{DD}$ via an adjustable (tunable) termination impedance $Z_{TUNE}$. This adjustable termination impedance $Z_{TUNE}$ is basically used for the same purpose as the termination resistor $R_0$ shown in FIG. 2. However, the impedance $Z_{TUNE}$ may be tuned to ensure the overall circuit is (approximately) balanced. A signal TX incident at the transmit port $P_{TX}$ is directed to the antenna port $P_{ANT}$ with a 90 degree phase shift (via one of the 90° phase shift elements). However, the signal TX incident at the transmit port $P_{TX}$ is not directed to the receive port $P_{RX}$ as the difference signal applied to the differential amplifier is zero (both input signals of the differential amplifier AMP are subject to the same phase shift). A signal ANT incident at the antenna port $P_{ANT}$ is amplified and output at the receive port $P_{RX}$ due to the two phase shifting elements, which provide a total phase shift of 180 degree between the two inputs of the differential amplifier AMP. The tunable impedance will be discussed in more detail with reference to FIGS. 6, 7 and 8.

Figure 5:
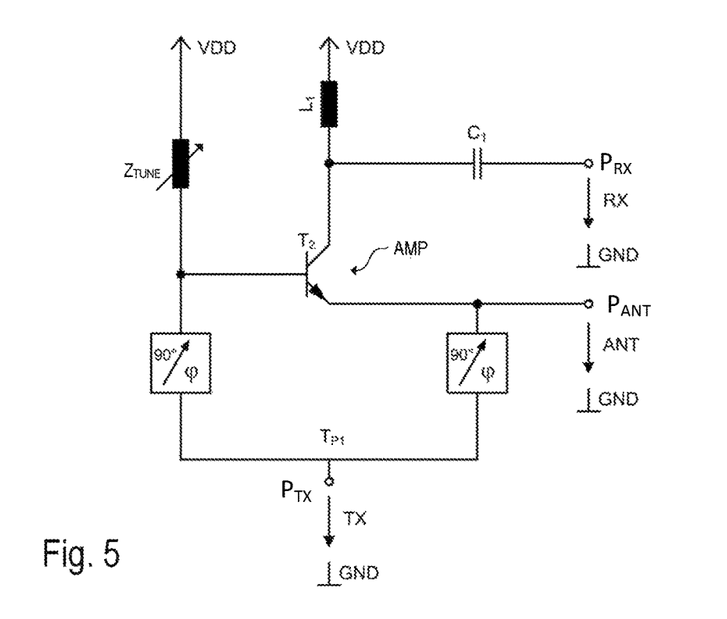
FIG. 5 is a simplified circuit diagram of an active quasi circulator circuit in accordance with a second example of the present disclosure.

The differential amplifier may be implemented using a bipolar junction transistor $T_2$ as shown in the example of FIG. 5. The base and the emitter of the transistor $T_2$ may be regarded as the inputs of the differential amplifier AMP, whereas the collector, which is coupled to the supply voltage VDD by a complex valued impedance $L_1$, may be regarded as output of the differential amplifier AMP. The receive port $P_{RX}$ is coupled to the collector of transistor $T_2$ via capacitor $C_1$, which decouples DC signal components from the port $P_{RX}$. Like in the previous example, a signal TX incident at the transmit port $P_{TX}$ is directed to the antenna port $P_{ANT}$ with a 90 degree phase shift (via one of the 90° phase shift elements), but not directed to the receive port $P_{RX}$ as the difference signal applied between base and emitter of transistor $T_2$ is zero (both input signals of the differential amplifier AMP are subject to the same phase shift). A signal ANT incident at the antenna port $P_{ANT}$ is amplified and output at the receive port $P_{RX}$ due to the two phase shifting elements, which provide a total phase shift of 180 degree between the base and the emitter of transistor $T_2$.

Figure 6:
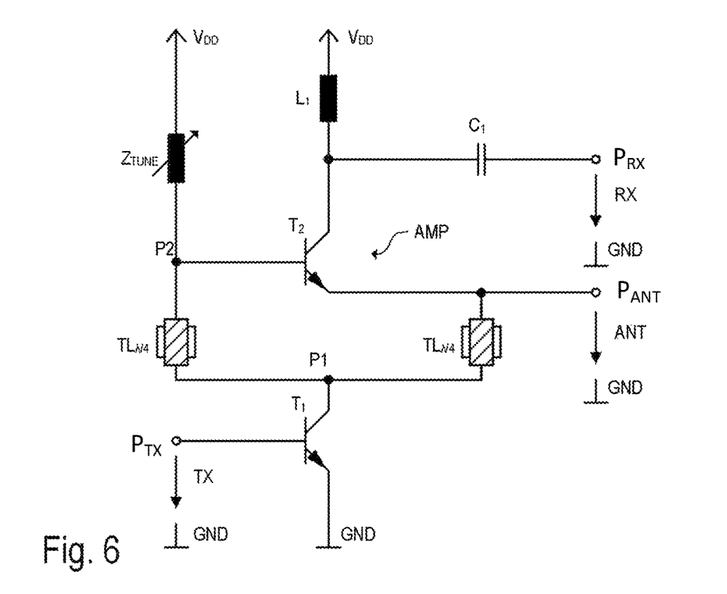
FIG. 6 is a simplified circuit diagram of an active quasi circulator circuit in accordance with a further example of the present disclosure.

The circuit of FIG. 6 is similar to the basic circuit of FIG. 1. Furthermore, the circuit of FIG. 6 is also very similar to the previous example of FIG. 5. Different from the example of FIG. 5, the present example has an additional input amplifier stage PRA (like the example shown in FIG. 1), which is implemented as transconductance amplifier stage. As compared to the example of FIG. 1, the resistor $R_0$ (which has a real-valued impedance) is replaced by a circuit representing a tunable impedance $Z_{TUNE}$ as already mentioned in the examples of FIGS. 4 and 5. When appropriately tuned, the tunable impedance $Z_{TUNE}$ can (at least partially) compensate for the negative effects of the abovementioned parasitic capacitances (see FIG. 3) and thus balance the circulator circuit so that half of the power of signal TX is directed to the antenna port and half of the power is dissipated in the termination provided by the tunable impedance $Z_{TUNE}$. Such a balancing of the quasi-circulator circuit entails an improvement of the isolation between the transmit port $P_{TX}$ and the receive port $P_{RX}$ (i.e. scattering parameter $S_{31}$ is minimized and ideally zero).

The tunable impedance $Z_{TUNE}$ can also compensate for a mismatch between the antenna impedance and the system impedance $Z_0$. Such an antenna impedance mismatch would also bring the circuit out-of balance and deteriorates the isolation between the transmit port $P_{TX}$ and the receive port $P_{RX}$. Besides the tunable impedance $Z_{TUNE}$ the circuit of FIG. 6 operates in the same way as the circuit of FIG. 1 and reference is made to the respective description above. Test measurements have shown that the transmission attenuation between the transmit port $P_{TX}$ and the receive port $P_{RX}$ is improved from 14 dB (without tunable impedance) to 30 dB or even 40-50 dB with appropriate fine tuning.

Figure 7:
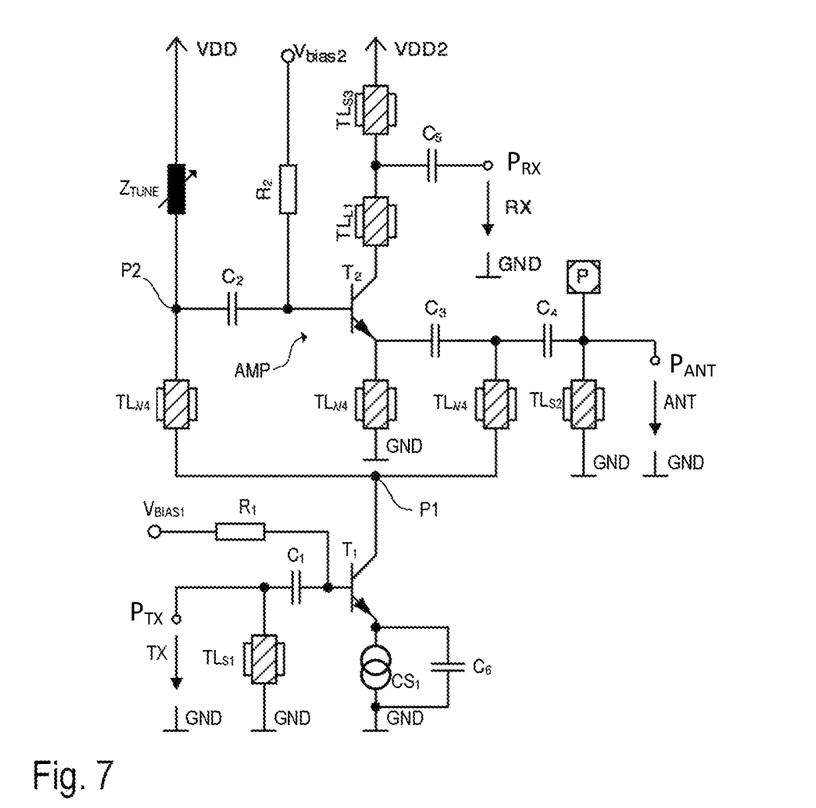
FIG. 7 is a circuit diagram of illustrating the active quasi circulator circuit of FIG. 6 in more details.

FIG. 7 is one example of a practical implementation of the basic circuit of FIG. 6. Basically, the circuit of FIG. 7 corresponds to the previous example of FIG. 6 with additional circuitry for biasing the transistors and decoupling DC signal components from the ports $P_{TX}$, $P_{RX}$, and $P_{ANT}$. Similar to the example of FIG. 6, the QC circuit is composed, inter alia, of two bipolar transistors $T_1$, $T_2$, two $\lambda/4$ transmission lines $TL_{\lambda/4}$ for coupling the two transistors $T_1$, $T_2$, the tunable impedance $Z_{TUNE}$ and the mentioned circuitry for biasing the transistors T1, T2 and decoupling DC signal components from the ports.

The biasing of transistor $T_1$ is provided by a bias voltage source providing a first bias voltage $V_{BIAS1}$, which is connected to the gate of transistor $T_1$ via resistor $R_1$, and a current source $CS_1$ connected between the emitter of transistor T1 and ground potential (at ground terminal GND). A capacitor $C_6$ is connected in parallel to the current source $CS_1$ to by-pass RF signals (capacitance $C_6$ may be regarded as short-circuit for RF signals). The quiescent point of transistor $T_1$ is determined by the current source $CS_1$, resistor $R_1$ and the first bias voltage $V_{BIAS1}$. The transmit port $P_{TX}$, at which the transmit signal TX is applied, is coupled to the base terminal of bipolar transistor $T_1$ via capacitor $C_1$. The delay line $TL_{S1}$ may be used for impedance matching at the transmit port $P_{TX}$. As in the previous example of FIG. 6, the collector terminal is connected to a circuit node that is denoted as P1.

The biasing of transistor $T_2$ is provided by a bias voltage source providing a second bias voltage $V_{BIAS2}$, which is connected to the gate of transistor $T_2$ via resistor $R_2$. Capacitor $C_2$ is connected between the gate of transistor $T_2$ and the common circuit node P2 of tunable impedance $Z_{TUNE}$ and one of the transmission lines $TL_{\lambda/4}$; capacitor $C_2$ is thus used to decouple DC signal components (base DC voltage of transistor $T_2$) from circuit node P2. However, the base of transistor $T_2$ is (by means of capacitor $C_2$) AC coupled to the supply potential $V_{DD}$ via the tunable impedance $Z_{TUNE}$. Capacitor $C_3$ is used to decouple DC signal components (emitter DC voltage of transistor $T_2$) from circuit node $P_3$, which is coupled to the antenna port $P_{ANT}$. Capacitor $C_4$ provides a DC decoupling of the antenna, and the delay line $TL_{S2}$ (together with capacitor $C_4$ and antenna pad P, which acts like a capacitor coupled between ground and the antenna port $P_{ANT}$) may be used for impedance matching.

Circuit node P1 (i.e. the output of the first transistor stage formed by transistor $T_1$) is connected to circuit nodes P2 and P3 via two $\lambda/4$-transmission lines $TL_{\lambda/4}$. Similar to the basic example of FIG. 6, the circuit node P1 is thus connected (via the two transmission lines $TL_{\lambda/4}$) to the base and the emitter of transistor $T_2$. However, this connection is only available for RF signals whereas DC signals are blocked by capacitors $C_2$ and $C_3$ respectively. A further $\lambda/4$-transmission lines $TL_{\lambda/4}$ is connected between the emitter of transistor $T_2$ and ground (ground terminal GND) in order to DC couple the emitter to ground (whereas RF signals are connected to circuit node P3 via capacitor C3 as mentioned above).

As compared to the basic example of FIG. 6, the inductor $L_1$ is replaced by transmission lines $TL_{L1}$ and $TL_{S3}$, which are coupled between the collector of transistor T2 and a supply voltage terminal providing a second supply voltage $V_{DD2}$. Accordingly, the common circuit node between the two transmission lines $TL_{L1}$ and $TL_{S3}$ are connected to the receive port via capacitor $C_5$. The purpose of capacitor $C_5$ is the same as in the example of FIG. 6, namely to block DC signals from the receive port $P_{RX}$. Generally, the present example may be regarded as one practical implementation of the basic circuit of FIG. 6.

In the present example, the size as well as the bias voltage $V_{BIAS1}$ of transistor $T_1$ (transconductance stage) may be designed for an input referred 1 dB compression point of 1 dBm. The base of transistor $T_1$ is connected to a circuit node at which the bias voltage $V_{BIAS1}$ is applied. To achieve a linear operation, the emitter of transistor $T_1$ is coupled with a bias circuit, which includes the current source $CS_1$ as mentioned above.

In the circuit design any parasitic elements between transistor $T_1$ and capacitor $C_6$ can be considered as they may have an impact on the gain as well as the impedance matching of the transconductance stage formed by transistor $T_1$. The size of transistor $T_2$ should be chosen small enough so that its miller capacitance $C_\mu$ (see FIG. 3) does not have a significant impact on the balance of the overall QC circuit. Nevertheless, the biasing of transistor $T_2$ may be designed to provide a good signal to noise ratio. The impedance connected at the emitter of transistor $T_2$ emitter is low, which may have an adverse effect on the reflection coefficient at the antenna port $P_{ANT}$. Therefore, the capacitor $C_3$ should be small.

Figure 8:
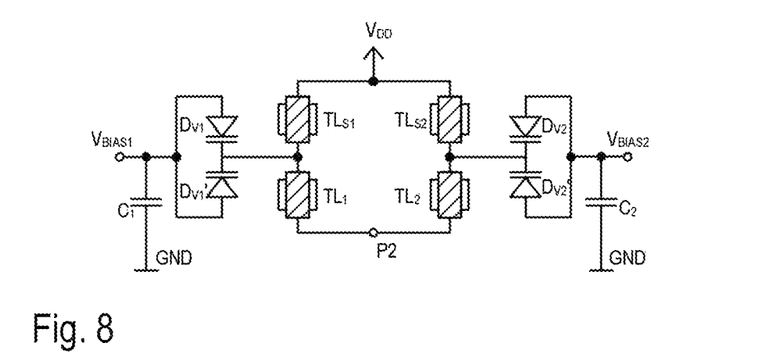
FIG. 8 is a circuit diagram illustrating one example of a tunable impedance circuit which may be used in the embodiment of FIG. 7.

FIG. 8 illustrates one example embodiment of the tunable impedance $Z_{TUNE}$ which may be used in the circuit of FIG. 7. The basic idea is connecting two varactor diodes $D_{V1}$, $D_{V1}'$ and $D_{V2}$, $D_{V2}'$ in parallel. The delay lines $TL_{S1}$ and $TL_{S2}$ shown in FIG. 8 are used to compensate for static capacitances in order to improve the dynamic range of the tunable impedance. The delay lines $TL_1$ and $TL_2$ are used for impedance transformation of the capacitances of the varactor diodes.

Figure 9:
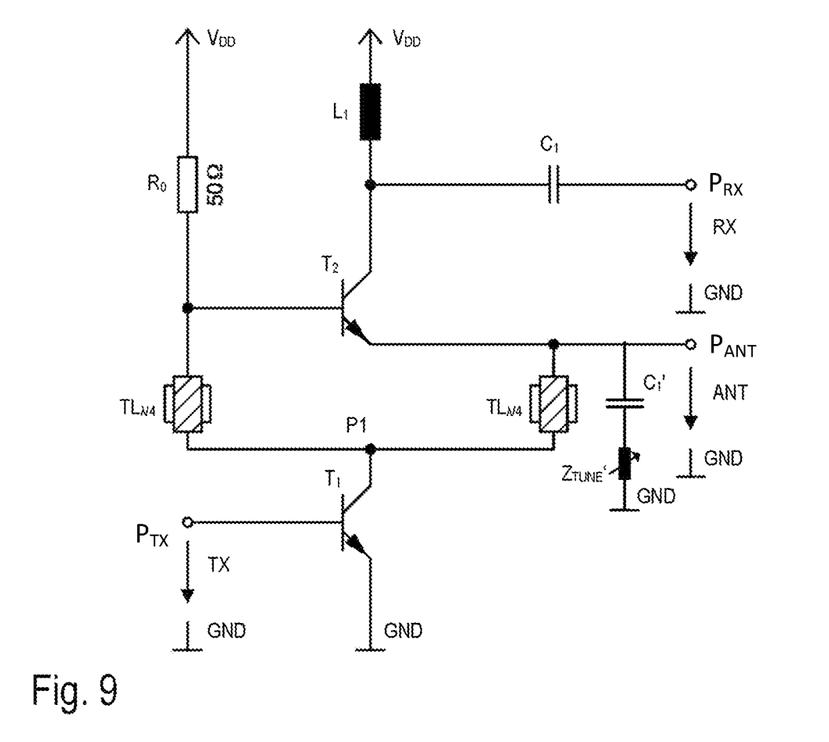
FIG. 9 is a simplified circuit diagram of an active quasi circulator circuit in accordance with another example of the present disclosure.

FIG. 9 illustrates another example implementation of a quasi-circulator which is an alternative to the previous example of FIG. 6. The present quasi-circulator is almost identical to the previous example, except that a fixed termination resistor $R_0$ is used between the circuit node P2 and the supply terminal for the supply voltage $V_{DD}$. In this case, the tunable impedance $Z_{TUNE}$ is coupled to the antenna port $P_{ANT}$. More precisely, a series circuit of the tunable impedance $Z_{TUNE}$ and a capacitor $C_1'$ is connected parallel to the antenna at the antenna port $P_{ANT}$. In this example, the tunable impedance $Z_{TUNE}$ should have a wider tuning range than in the previous example of FIG. 6. Furthermore, the tunable impedance cannot compensate for an arbitrary impedance mismatch of the antenna as it is coupled parallel to the antenna.

Although the disclosure has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An RF quasi circulator circuit, comprising:
a receive port, a transmit port and an antenna port;
a differential amplifier stage having a first input, a second input, and an output that is coupled to the receive port;
a first phase shifting element and a second phase shifting element, the first phase shifting element being coupled between the transmit port and the first input of the differential amplifier, and the second phase shifting element being coupled between the transmit port and the second input of the differential amplifier, the antenna port being coupled to the first input of the differential amplifier, and the antenna port being coupled to the second input of the differential amplifier via the first phase shifting element and the second phase shifting element, wherein the first phase shifting element provides a first phase shift, and the second phase shifting element provides a second phase shift, and wherein the first phase shift and the second phase shift add together to cause a total phase shift of 180 degrees between the first input and the second input of the differential amplifier for a signal incident at the antenna port; and
a tunable impedance coupled to the differential amplifier, wherein the tunable impedance is controlled to tune a damping in a signal path from the transmit port to the receive port.

2. The RF quasi circulator of claim 1,
wherein the tunable impedance is controlled to maximize the damping in the signal path from the transmit port to the receive port.

3. The RF quasi circulator of claim 1,
wherein the first phase shifting element and the second phase shifting element each provides a 90 degree phase shift.

4. The RF quasi circulator of claim 1,
wherein at least one of the first and the second phase shifting elements is a delay line.

5. The RF quasi circulator of claim 1, further comprising:
an additional amplifier stage comprising an input coupled to the transmit port, and an output coupled to the first phase shifting element and to the second phase shifting element,
wherein the antenna port is coupled to the output of the additional amplifier via the first phase shifting element.

6. The RF quasi circulator of claim 5, wherein the additional amplifier stage includes at least one transistor stage including one or more transistors.

7. The RF quasi circulator of claim 6, wherein the additional amplifier stage includes at least one transconductance stage having an output node, which is coupled to the antenna port via the first phase shifting element and which is coupled to the tunable impedance via the second phase shifting element.

8. The RF quasi circulator circuit of claim 1,
wherein the tunable impedance includes at least one tunable capacitance.

9. The RF quasi circulator circuit of claim 1, wherein the tunable impedance is coupled to the second input of the differential amplifier or to the antenna port.

10. The RF quasi circulator circuit of claim 9, wherein the tunable impedance is coupled to the antenna port in parallel with or in series to an antenna.

11. An RF quasi circulator circuit, comprising:
a receive port, a transmit port and an antenna port;
a first amplifier stage coupling the transmit port to the antenna port and configured to direct signals received at the transmit port to the antenna port;
a second amplifier stage that is a differential amplifier stage coupling the antenna port and the receive port, and configured to direct signals received at the antenna port to the receive port;
a first phase shifting element and a second phase shifting element, the first phase shifting element being coupled between the transmit port and a first input of the second amplifier stage, and the second phase shifting element being coupled between the transmit port and a second input of the second amplifier stage, the antenna port being coupled to the first input of the second amplifier stage, and the antenna port being coupled to the second input of the second amplifier stage via the first phase shifting element and the second phase shifting element, wherein the first phase shifting element provides a first phase shift, and the second phase shifting element provides a second phase shift, and wherein the first phase shift and the second phase shift add together to cause a total phase shift of 180 degrees between the first input and the second input of the second amplifier stage for a signal incident at the antenna port; and
a tunable impedance coupled to the second amplifier stage, the tunable impedance being controlled to tune a damping in a signal path from the transmit port to the receive port.

12. The RF quasi circulator circuit of claim 11, wherein the first amplifier stage is a transconductance stage having an output node, which is coupled to the antenna port via a first transmission line and which is coupled to the tunable impedance via a phase shifting element.

13. The RF quasi circulator circuit of claim 12, wherein the second amplifier stage includes at least one second transistor having a base and an emitter, the antenna port being coupled to the emitter of the transistor and to the base of the transistor via a signal path that causes a 180° phase lag.

14. The RF quasi circulator circuit of claim 13,
wherein the signal path that causes a 180° phase lag includes at least one delay line.

15. The RF quasi circulator circuit of claim 13,
wherein the base of the transistor is AC coupled to a supply potential via the tunable impedance.

16. The RF quasi circulator circuit of claim 12,
wherein the phase shifting element includes at least one delay line.

17. The RF quasi circulator circuit of claim 11,
wherein the tunable impedance is coupled to the antenna port in parallel or coupled to an antenna in series.

18. The RF quasi circulator circuit of claim 17, wherein the tunable impedance includes at least one capacitance.

19. The RF quasi circulator circuit of claim 17, wherein the tunable impedance includes at least one varactor diode.

20. The RF quasi circulator of claim 11, wherein the tunable impedance is controlled to maximize the damping in the signal path from the transmit port to the receive port.

* * * * *